United States Patent
Lee et al.

(10) Patent No.: US 9,627,454 B2
(45) Date of Patent: Apr. 18, 2017

(54) ORGANIC LIGHT EMITTING DISPLAY DEVICE HAVING DUMMY SUB-PIXELS

(71) Applicant: LG Display Co., Ltd., Seoul (KR)

(72) Inventors: Kyungsu Lee, Seoul (KR); Incheol Park, Paju-si (KR); Jimin Choi, Cheongju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/202,305

(22) Filed: Jul. 5, 2016

(65) Prior Publication Data

US 2016/0315128 A1   Oct. 27, 2016

Related U.S. Application Data

(62) Division of application No. 14/106,789, filed on Dec. 15, 2013, now Pat. No. 9,490,305.

(30) Foreign Application Priority Data

Dec. 28, 2012 (KR) .......................... 10-2012-0157537

(51) Int. Cl.
| | | |
|---|---|---|
| *H01L 51/05* | (2006.01) | |
| *H01L 51/00* | (2006.01) | |
| *H01L 51/50* | (2006.01) | |
| *H01L 51/56* | (2006.01) | |
| *H01L 27/12* | (2006.01) | |
| *B82Y 10/00* | (2011.01) | |
| *B82Y 30/00* | (2011.01) | |

(Continued)

(52) U.S. Cl.
CPC ....... *H01L 27/3223* (2013.01); *G09G 3/3233* (2013.01); *G09G 3/3283* (2013.01); *H01L 27/3213* (2013.01); *H01L 27/3244* (2013.01); *G09G 2300/043* (2013.01); *G09G 2300/0413* (2013.01); *G09G 2300/0452* (2013.01); *G09G 2300/0819* (2013.01); *G09G 2320/0233* (2013.01)

(58) Field of Classification Search
CPC ............. H01L 51/0545; H01L 51/0036; H01L 51/0541; H01L 51/5012; H01L 27/1214; H01L 51/56; B82Y 10/00; B82Y 30/00; Y02E 10/50
USPC ....................................... 257/40; 438/82, 99
See application file for complete search history.

(56) References Cited

U.S. PATENT DOCUMENTS

| | | |
|---|---|---|
| 2006/0061524 A1 | 3/2006 | Suh et al. |
| 2008/0024415 A1 | 1/2008 | Jung et al. |

(Continued)

FOREIGN PATENT DOCUMENTS

| | | |
|---|---|---|
| CN | 1881061 A | 12/2006 |
| CN | 101996575 A | 3/2011 |
| DE | 69826568 T2 | 10/2005 |

OTHER PUBLICATIONS

Chinese Office Action, Chinese Application No. 201310711874.3, Feb. 1, 2016, 11 pages.

(Continued)

*Primary Examiner* — John C Ingham
*Assistant Examiner* — Didarul Mazumder
(74) *Attorney, Agent, or Firm* — Fenwick & West LLP

(57) ABSTRACT

Provided are an organic light emitting display device, the display device including: a substrate defined into a display area and a non-display area; sub-pixels formed on the display area of the substrate; and dummy sub-pixels formed on the non-display area of the substrate, the dummy sub-pixels have a different shape for each position of the non-display area.

9 Claims, 11 Drawing Sheets

(51) Int. Cl.
*H01L 27/32* (2006.01)
*G09G 3/3233* (2016.01)
*G09G 3/3283* (2016.01)

(56) References Cited

U.S. PATENT DOCUMENTS

| | | |
|---|---|---|
| 2009/0016001 A1 | 1/2009 | Miyakawa et al. |
| 2011/0037786 A1 | 2/2011 | Hasegawa et al. |
| 2011/0037789 A1 | 2/2011 | Hisakawa |
| 2011/0315853 A1 | 12/2011 | Cho et al. |
| 2012/0092607 A1 | 4/2012 | Hui |
| 2012/0127412 A1 | 5/2012 | Lee et al. |

OTHER PUBLICATIONS

German Office Action, German Application No. 10 2013 114 696.1, Aug. 14, 2015, 10 pages.
United States Office Action, U.S. Appl. No. 14/106,789, Jan. 15, 2016, 7 pages.
United States Office Action, U.S. Appl. No. 14/106,789, Aug. 4, 2015, 8 pages.
United States Office Action, U.S. Appl. No. 14/106,789, May 26, 2015, 7 pages.
United States Office Action, U.S. Appl. No. 14/106,789, Jan. 8, 2015, 8 pages.

(a)

(b)

ORGANIC LIGHT EMITTING DISPLAY DEVICE HAVING DUMMY SUB-PIXELS

This application is a divisional application of U.S. patent application Ser. No. 14/106,789 filed on Dec. 15, 2013, which claims the benefit of Republic of Korea Patent Application No. 10-2012-0157537 filed on Dec. 28, 2012, all of which are hereby incorporated by reference in their entirety.

BACKGROUND

Field

The present disclosure relates to an organic light emitting display device.

Related Art

An organic light emitting element used for an organic light emitting display device is a self-emitting element having a light emission layer formed between two electrodes. In the organic light emitting element, electrons from the cathode which is electron injection electrode and holes from the anode which is hole injection electrode are injected into the light emitting layer and combined to generate excitons and light is emitted when the excitons are dropped from an excited state to a ground state.

The organic light emitting display device using the organic light emitting element is classified into a top-emission type, a bottom-emission type and a dual-emission type according to its light emitting direction and divided into a passive matrix type and an active matrix type according to its driving method.

When scan signals, data signals and power are supplied to a plurality of sub-pixels arranged in a matrix form, the selected sub-pixel emits the light, such that the organic light emitting display device may display images.

A display panel of the organic light emitting display device is provided with a dummy sub-pixel. The dummy sub-pixel is formed at a non-display area which is an area outside of a display area of the display panel. The dummy sub-pixel is used to reduce process variation or side effects during a process of manufacturing the display panel. In addition, the dummy sub-pixel is used to compensate a driving voltage or a driving current after the display panel is manufactured. These are merely examples of some uses of dummy sub-pixels. However, the dummy sub-pixel according to the related art is formed in the same way without considering the purposes.

SUMMARY

An aspect of the present disclosure provides an organic light emitting display device comprising a substrate defined into a display area and a non-display area; sub-pixels formed on the display area of the substrate; and dummy sub-pixels formed on the non-display area of the substrate, the dummy sub-pixels have a different shape for each position of the non-display area.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Reference will now be made in detail embodiments of the disclosure examples of which are illustrated in the accompanying drawings.

Hereinafter, embodiments of the present disclosure will be described in detail with reference to the accompanying drawings.

Figure 1:
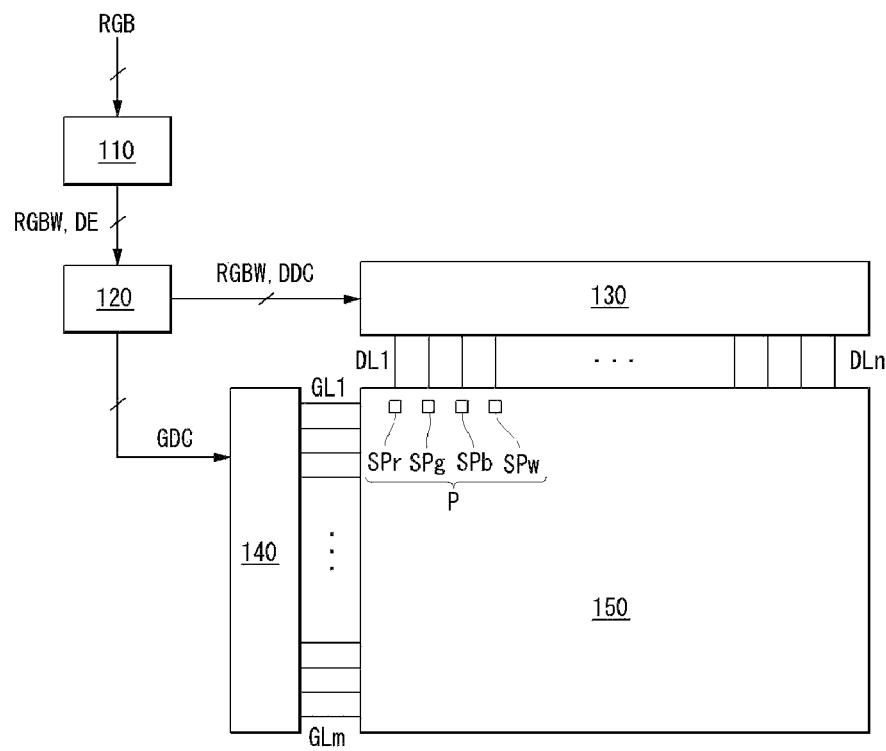
FIG. 1 is a schematic configuration view of an organic light emitting display device according to an embodiment of the present disclosure.
Figure 2:
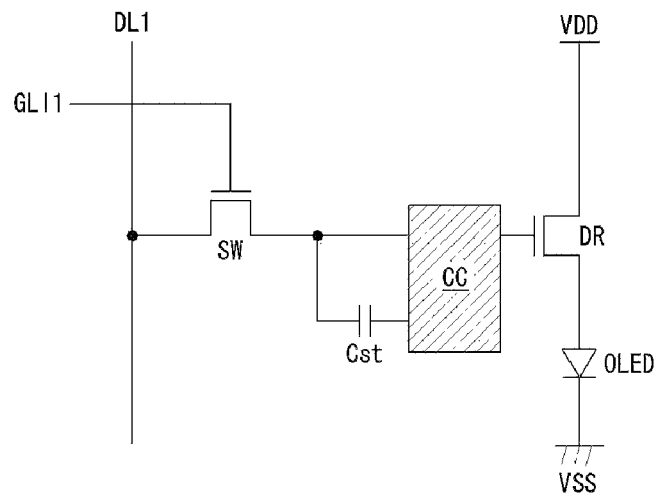
FIG. 2 is a circuit diagram showing a circuit configuration of a sub-pixel.
Figure 3:
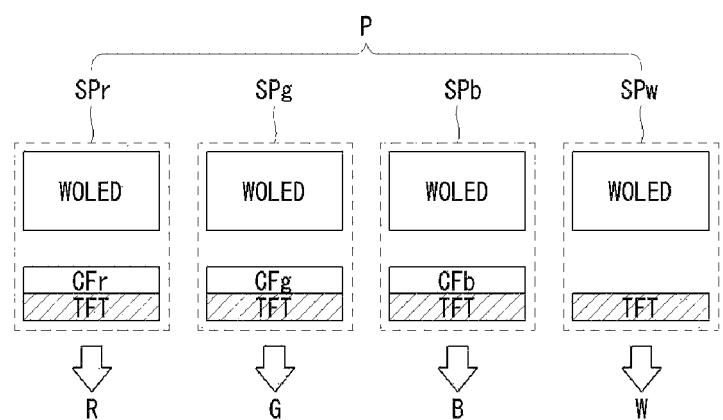
FIG. 3 is a first exemplified diagram showing a cross-sectional layer view of a sub-pixel.
Figure 4A:
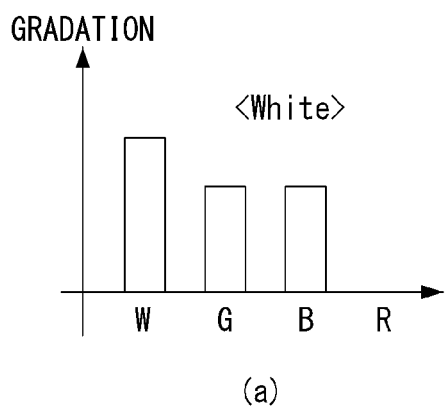
FIGS. 4A and 4B are views for explaining a concept of compensating emission of a sub-pixel.
Figure 4B:
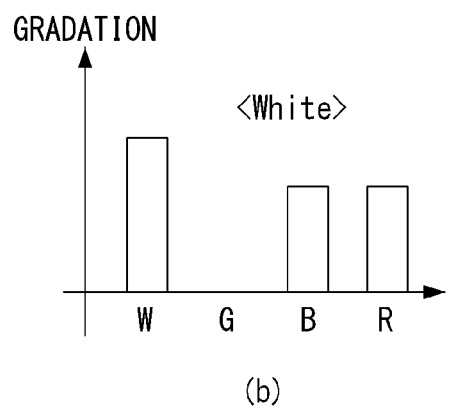
Figure 5:
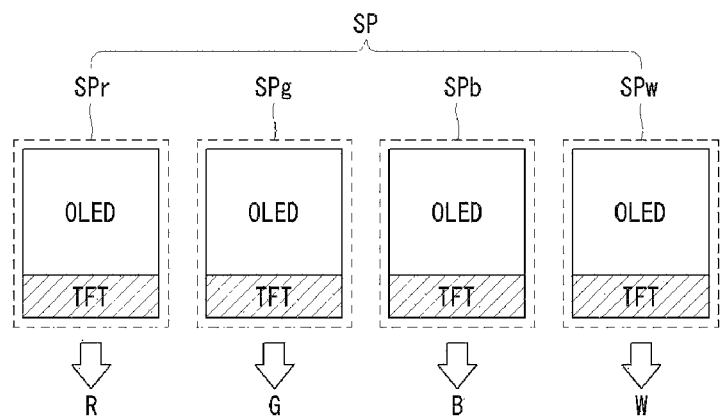
FIG. 5 is a second exemplified diagram showing a cross-sectional layer view of a sub-pixel.

FIG. 1 is a schematic configuration view of an organic light emitting display device according to an embodiment of the present disclosure, FIG. 2 is a circuit diagram showing a circuit configuration of a sub-pixel, FIG. 3 is a first exemplified diagram showing a cross-sectional layer view of a sub-pixel, FIGS. 4A and 4B are views for explaining a concept of compensating emission of a sub-pixel, and FIG. 5 is a second exemplified diagram showing a cross-sectional layer view of a sub-pixel.

As shown in FIG. 1, an organic light emitting display device according to an embodiment of the present disclosure is configured to include an image processing unit 110, a timing controlling unit 120, a data driving 130, a gate driving unit 140 and a display panel 150.

The image processing unit 110 converts RGB data signals into RGBW data signals. The image processing unit 110 sets a gamma voltage to implement peak luminance according to an average picture level (APL) by using the RGB data signals. The image processing unit 110 performs various types of image processing and then, outputs the RGBW data signals. The image processing unit 110 outputs a data enable signal (DE) together with the RGBW data signals. The image processing unit 110 may output at least one of a vertical synchronizing signal (VSYNC), a horizontal synchronizing signal (HSYNC) and a clock signal (CLK) in addition to the data enable signal DE, but these signals will be omitted for convenience of explanation.

The timing controlling unit 120 receives a driving signal including the data enable signal DE or the vertical synchronizing signal (VSYNC), the horizontal synchronizing signal (HSYNC) and the clock signal (CLK) from the image processing unit 110. The timing controlling unit 120 outputs a gate timing control signal GDC for controlling an operation timing of the gate driving unit 140 and a data timing control signal DDC for controlling an operation timing of the data driving unit 130, based on the driving signal. The timing controlling unit 120 outputs the RGBW data signals RGBW corresponding to the gate timing control signal GDC and the data timing control signal DDC.

In response to the data timing control signal DDC supplied from the timing controlling unit 120, the data driving unit 130 samples the RGBW data signals supplied from the timing controlling unit 120 and latches the sampled signals to convert and output them into a gamma reference voltage. The data driving unit 130 outputs the RGBW data signals through data lines DL1 to DLn. The data driving unit 130 is formed in an integrated circuit (IC) form.

In response to the gate timing control signal GDC supplied from the timing controlling unit 120, the gate driving unit 140 outputs the gate signal while shifting level of the gate voltage. The gate driving unit 140 outputs a gate signal through gate lines GL1 to GLm. The gate driving unit 140 is formed in the IC form or is formed on the display panel 150 in a gate in panel scheme.

The display panel 150 is implemented in a structure including a white sub-pixel SPw, a red sub-pixel SPr, a green sub-pixel SPg and a blue sub-pixel SPb (hereinafter, referred to as RGBW sub-pixels) in order to prevent the color degradation and the luminance degradation of a pure color while increasing light efficiency. That is, a single pixel P is made of the RGBW sub-pixels (SPw, SPr, SPg and SPb).

As shown in FIG. 2, each of the sub-pixels includes a switching transistor SW, a driving transistor DR, a capacitor Cst, a compensating circuit CC and an organic light emitting diode OLED. The organic light emitting diode OLED operates to emit light according to the driving current formed by the driving transistor DR.

In response to a gate signal supplied through a first gate line GL1, the switching transistor SW performs a switching operation to allow a data signal supplied through a first data line DL1 to be stored as a data voltage in the capacitor Cst. The driving transistor DR operates to allow a driving current to flow between a first power source terminal VDD and a second power source terminal GND according to the data voltage stored in the capacitor Cst.

The compensating circuit CC compensates a threshold voltage of the driving transistor DR. The compensating circuit CC is configured of at least one of transistors and capacitors. Since the compensating circuit CC has various compositions, a detailed description thereof will be omitted.

Each of the sub-pixels is configured to have a 2T (transistor) 1C (capacitor) structure including the switching transistor SW, the driving transistor DR, the capacitor Cst, and the organic light emitting diode OLED. However, when the compensating circuit CC is added, each of the sub-pixels is configured to have a structure such as 3T1C, 4T2C, 5T2C, or the like. The sub-pixel having the above-mentioned configuration is formed by a top-emission type, a bottom-emission type or a dual-emission type according to the structure.

The RGBW sub-pixels SPr, SPg, SPb, and SPw are implemented by using a white organic light emitting diode WOLED and RGB color filters CFr, CFg, and CFb or are formed by dividing the light-emitting material included in the organic light emitting diode OLED into the RGBW colors. The method of using the white organic light emitting diode WOLED and the RGB color filters CFr, CFg, and CFb is as follows.

[The Method of Using the White Organic Light Emitting Diode and the RGB Color Filters]

As shown in FIG. 3, the RGB sub-pixels SPr, SPg, and SPb include a thin film transistor TFT, the RGB color filters CFr, CFg and CFb, and the white organic light emitting diode WOLED. On the other hand, the white sub-pixel SPw includes the thin film transistor TFT and the white organic light emitting diode WOLED.

The RGB sub-pixels SPr, SPg, and SPb converts the white light emitted from the white organic light emitting diode WOLED into red light, green light and blue light, such that the RGB sub-pixels SPr, SPg, and SPb include the RGB color filters CFr, CFg and CFb, respectively. Unlike this, the white sub-pixel SPw emits the white light emitted from the white organic light emitting diode WOLED, as it is, such that the white sub-pixel SPw does not include the color filter.

The method deposits the white light-emitting material in all sub-pixels unlike the method of independently depositing red, green and blue light-emitting materials in the each of the sub-pixels. Therefore, the organic light emitting display device may be manufactured in a large size without using a fine metal mask and may reduce the power consumption together with the extending lifespan by applying the method.

The display panel 150 arranges the sub-pixels by various methods in order to adjust a color coordinate while enhancing color purity and color expression. For example, the display panel 150 may have a structure in which the sub-pixels are arranged in order of RGBW sub-pixels SPr, SPg, SPb and SPw. In addition, the display panel 150 may have a structure in which the sub-pixels are arranged in order of WRGB sub-pixels SPw, SPr, SPg and SPb. In addition, the display panel 150 may have a structure in which the sub-pixels are arranged in order of WGBR sub-pixels SPw, SPg, SPb and SPr. In addition, the display panel 150 may have a structure in which the sub-pixels are arranged in order of RWGB sub-pixels SPr, SPw, SPg and SPb. In addition, the display panel 150 may have a structure in which the sub-pixels are arranged in order of BGWR sub-pixels SPb, SPg, SPw and SPr. The display panel 150 may have a structure in which the sub-pixels are arranged in various orders in addition to the above-mentioned examples.

As described above, the organic light emitting display device emits the light by compensating a portion or all of the RGB sub-pixels SPr, SPg and SPb together with the white sub-pixel SPw so that the coordinate of the desired color is displayed on the display panel 150 using the RGBW sub-pixels SPr, SPg, SPb and SPw.

As an example, as shown in (a) of FIG. 4A, the organic light emitting display device emits the light by compensating the GB sub-pixels SPg and SPb together with the white sub-pixel SPw so that the color coordinated of the desired white light is displayed on the display panel 150. As another example, as shown in (b) of FIG. 4B, the organic light emitting display device emits the light by compensating the BR sub-pixels SPb and SPr together with the white sub-pixel SPw so that the color coordinated of the desired white light is displayed on the display panel 150.

[The Method of Forming to Divide the Light-Emitting Material Included in the Organic Light Emitting Diode into RGBW Colors]

As shown in FIG. 5, the RGBW sub-pixels SPr, SPg, SPb and SPw include the thin film transistor TFT and the red, green, blue and white organic light emitting diodes OLED, respectively. The method independently deposits the red, green, blue and white light-emitting materials in the each sub-pixel. Thus, since the method independently forms the red, green, blue and white light-emitting materials by using the fine metal mask, the color filter is not included.

According to an embodiment of the present disclosure, a single pixel P configuring the display panel 150 may be constituted by four RGBW sub-pixels. However, the single pixel P configuring the display panel 150 may be constituted by three RGB sub-pixels.

Meanwhile, the display panel 150 as described above is provided with a dummy sub-pixel. The dummy sub-pixel is formed at a non-display area which is an area outside of a display area of the display panel 150. According to an embodiment of the present disclosure, a shape, the number and the arrangement structure of the dummy sub-pixel which is formed on the non-display area of the display panel are different for each position. A detailed description thereof will be described below.

Figure 6:
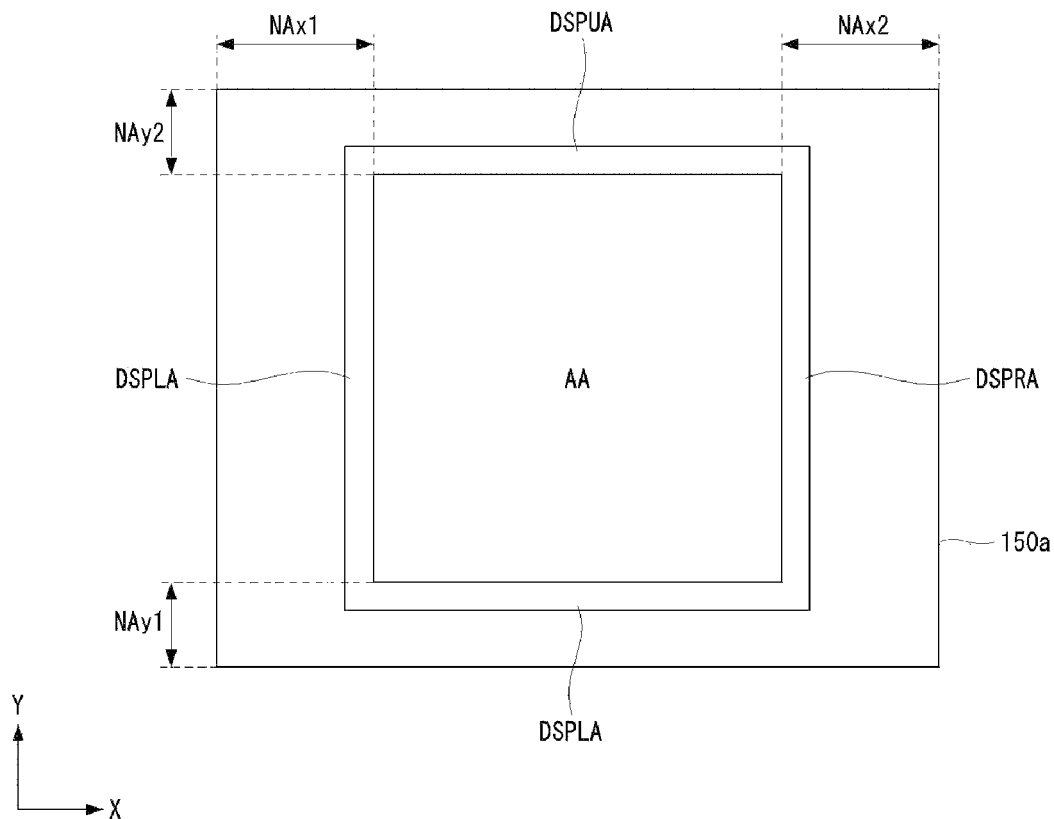
FIG. 6 is a view showing an arrangement of a dummy sub-pixel according to an embodiment of the present disclosure.
Figure 7:
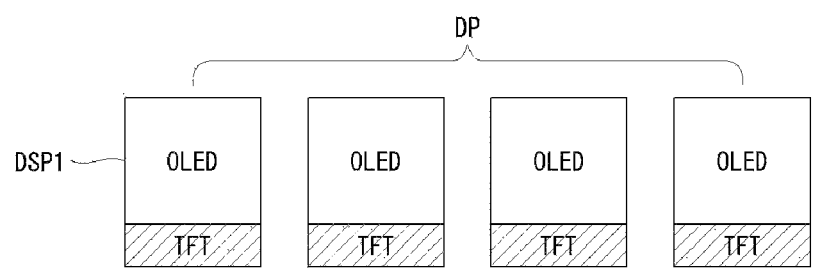
FIG. 7 to FIG. 9 are views showing various shapes of dummy sub-pixels.
Figure 8:
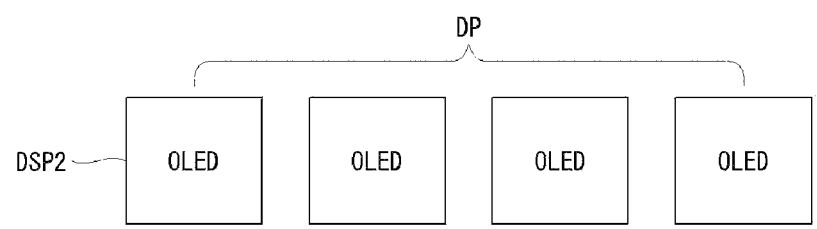
Figure 9:
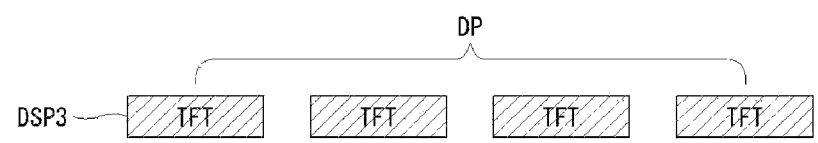

FIG. 6 is a view showing an arrangement of a dummy sub-pixel according to an embodiment of the present disclosure, and FIG. 7 to FIG. 9 are views showing various shapes of dummy sub-pixels.

A substrate 150a configuring the display panel is defined as a display area AA in which the sub-pixels emitting the light to the outside are formed and a non-display area NAx1 to NAy2 disposed at an outer portion of the display area AA and having the dummy sub-pixel formed therein. The non-display areas NAx1 to NAy2 are defined by an upper non-display area NAy2 positioned at the upper portion of the display area AA, a lower non-display area NAy1 positioned at the lower portion thereof, a right non-display area NAx2 positioned at the right side thereof and a left non-display area NAx1 positioned at the left side thereof, respectively.

The upper non-display area NAy2 may be redefined as an upper dummy sub-pixel area DSPUA in which the upper dummy sub-pixels are formed, the lower non-display area NAy1 may be redefined as a lower dummy sub-pixel area DSPLA in which the lower dummy sub-pixels are formed, the right non-display area NAx2 may be redefined as a right dummy sub-pixel area DSPRA in which the right dummy sub-pixels are formed, and the left non-display area NAx1 may be redefined as a left dummy sub-pixel area DSPLA in which the left dummy sub-pixels are formed. At least one of the upper dummy sub-pixel area DSPUA, the lower dummy sub-pixel area DSPLA, the right dummy sub-pixel area DSPRA and the left dummy sub-pixel area DSPLA will be omitted.

Meanwhile, the dummy sub-pixels formed on the upper dummy sub-pixel area DSPUA, the lower dummy sub-pixel area DSPLA, the right dummy sub-pixel area DSPRA and the left dummy sub-pixel area DSPLA are configured in forms as shown in FIG. 7 to FIG. 9. However, the dummy sub pixel may not include the color filter unlike the sub-pixels, therefore, FIG. 7 to FIG. 9 are not shown the color filter in order to show only the configuration corresponding to an opening and a non-opening of the dummy sub-pixel.

As shown in FIG. 7, a first dummy sub-pixel DSP1 has the same shape as the sub-pixels formed on the display area AA. The first dummy sub-pixel DSP1 includes the organic light emitting diode OLED part corresponding to the opening of the sub-pixels and the thin firm transistor TFT part corresponding to the non-opening of the sub-pixels.

As shown in FIG. 8, a second dummy sub-pixel DSP2 has the shape corresponding to the opening of the sub-pixels formed on the display area AA. The second dummy sub-pixel DSP2 includes only the organic light emitting diode OLED part corresponding to the opening of the sub-pixels.

As shown in FIG. 9, a third dummy sub-pixel DSP3 has the shape corresponding to the non-opening of the sub-pixels formed on the display area AA. The third dummy sub-pixel DSP3 includes only the thin film transistor TFT part corresponding to the non-opening of the sub-pixels.

Meanwhile, the present disclosure describes a case in which a single pixel is configured to include the RGBW sub-pixels, and thus, in a case of the dummy sub-pixels, the four dummy sub-pixels are defined as a single dummy pixel DP. However, in the case in which the single pixel is configured the RGB sub-pixels, the three dummy sub-pixels are defined as the single dummy sub-pixels.

As shown in FIG. 7 to FIG. 9, at least one of the dummy sub-pixels DSP1 to DSP3 has a different shape for each position. For example, as in the embodiment of the present disclosure, the case in which the four dummy sub-pixels is selectively formed on edges up, down, right, and left of the non-display areas NAx1 to NAy2, the number of 1365 cases are derived from the combination and the arrangement of the shapes of the four dummy sub-pixels. Hereinafter, embodiments of the present disclosure will be described with reference to FIG. 7 to FIG. 9.

FIG. 10 to FIG. 15 are views showing various arrangements of dummy sub-pixels.

A First Example

Figure 10:
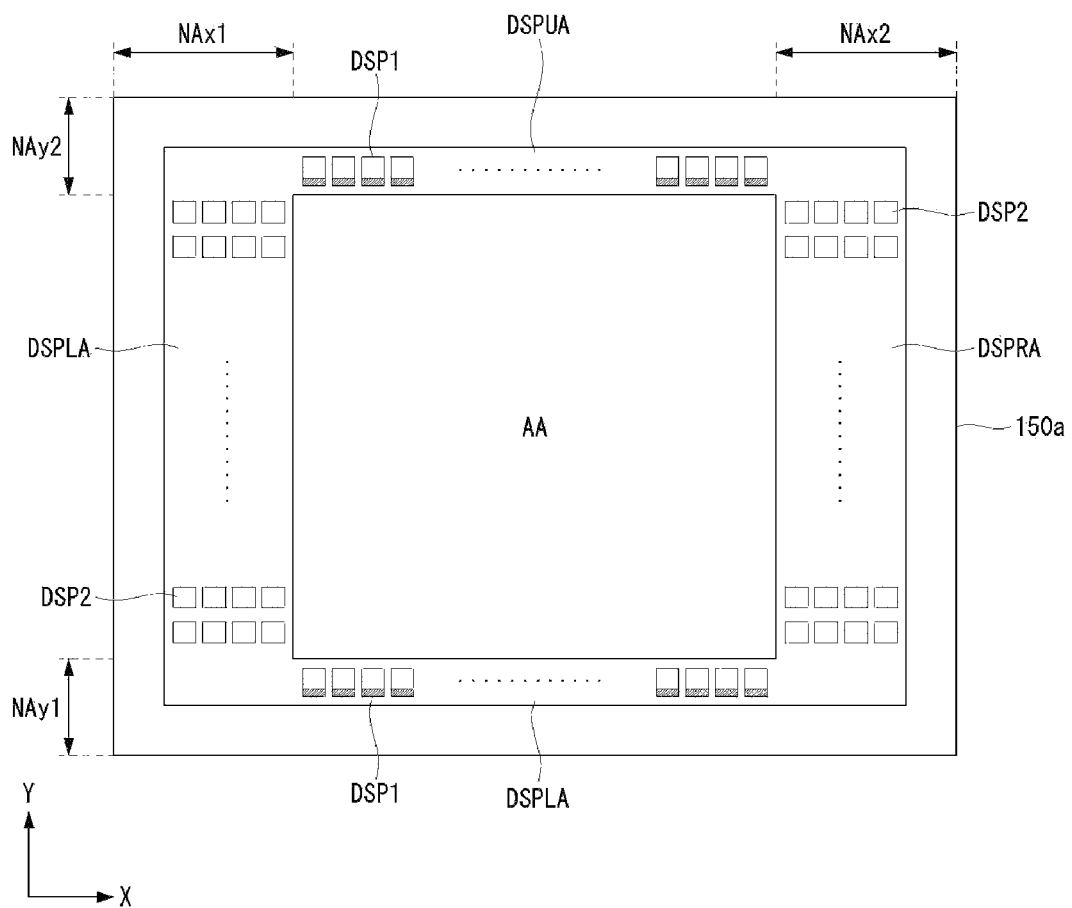
FIG. 10 to FIG. 15 are views showing various arrangements of dummy sub-pixels.

As shown in FIG. 10, the dummy sub-pixels according to a first example are disposed so that the shapes of up and down or left and right based on the display area AA are the same.

The upper dummy sub-pixels formed at the upper portion of the display area AA have the same arrangement structure as the lower dummy sub-pixels formed at the lower portion thereof. That is, the upper dummy sub-pixel area DSPUA and the lower dummy sub-pixel area DSPLA are provided with the first dummy sub-pixels DSP1. Further, the right dummy sub-pixels formed at the right side of the display area AA have the same arrangement structure as the left dummy sub-pixels formed at the left side thereof. That is, the right dummy sub-pixel area DSPRA and the left dummy sub-pixel area DSPLA are provided with the second dummy sub-pixels DSP2.

Meanwhile, the arrangement structure of the dummy sub-pixel shown in FIG. 10 is only example, the upper dummy sub-pixel area DSPUA and the lower dummy sub-pixel area DSPLA may be provided with the second dummy sub-pixels DSP2, and the right dummy sub-pixel area DSPRA and the left dummy sub-pixel area DSPLA may be provided with the first dummy sub-pixels DSP1.

Unlike this, the upper dummy sub-pixel area DSPUA and the lower dummy sub-pixel area DSPLA may be provided with the third dummy sub-pixels DSP3, and the right dummy sub-pixel area DSPRA and the left dummy sub-pixel area DSPLA may be provided with the second dummy sub-pixels DSP2. In addition, when combining the dummy sub-pixels DSP1 to DSP3 shown in FIG. 7 to FIG. 9, the combination of the dummy sub-pixels may be changed by those skilled in the art. For example, the arrangement of the dummy sub-pixels may be changed in the method of deleting (or non-forming) the dummy sub-pixels included in the portion of the upper dummy sub-pixel area DSPUA, the lower dummy sub-pixel area DSPLA, the right dummy sub-pixel area DSPRA and the left dummy sub-pixel area DSPLA.

A Second Example

Figure 11:
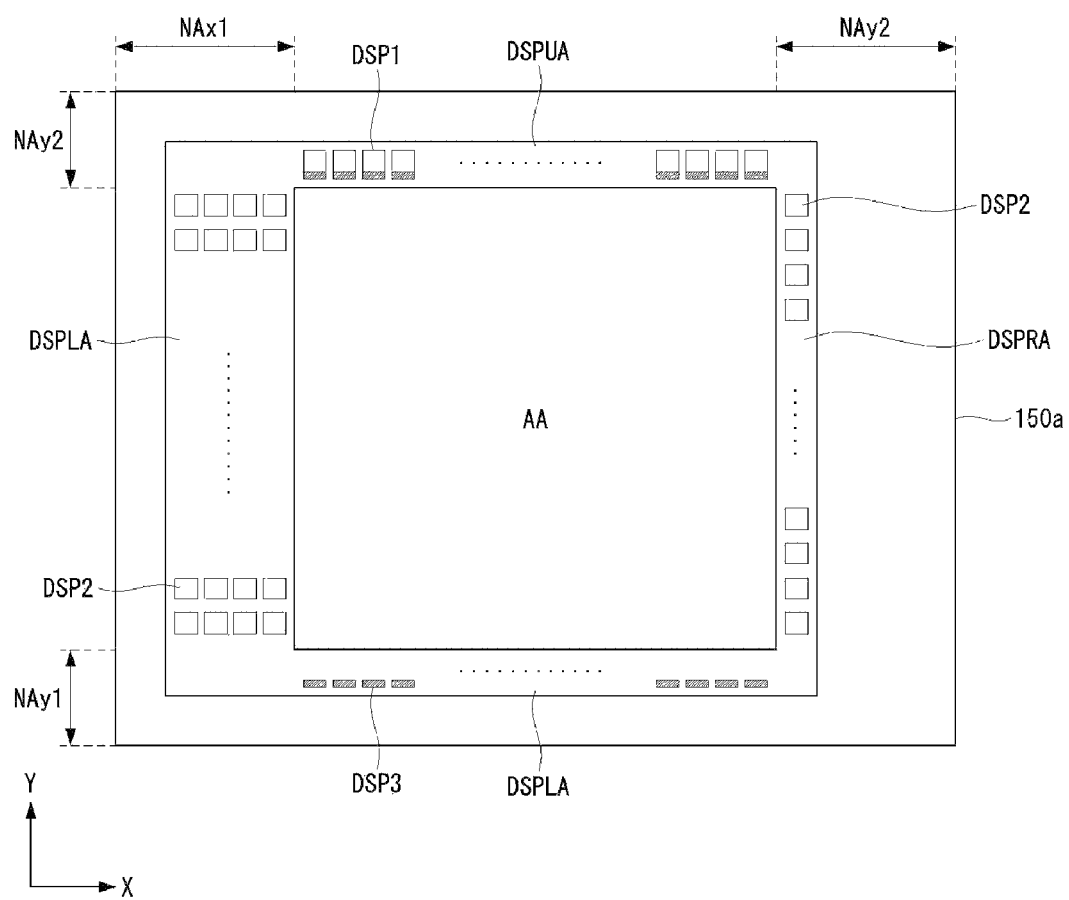

As shown in FIG. 11, the dummy sub-pixels according to a second example are disposed so that the shape of up and down and left and right based on the display area AA are different.

The upper dummy sub-pixels formed at the upper portion of the display area AA have the different arrangement structure from the lower dummy sub-pixels formed at the lower portion thereof. That is, the upper dummy sub-pixel area DSPUA is provided with the dummy sub-pixels DSP1 and the lower dummy sub-pixel area DSPLA is provided with the third dummy sub-pixels DSP3. Further, the right dummy sub-pixels formed at the right side of the display area AA have the different arrangement structure from the left dummy sub-pixels formed at the left side thereof. That is, while the right dummy sub-pixel area DSPRA is provided with the second dummy sub-pixels DSP2 arranged in a line, the left dummy sub-pixel area DSPLA is provided with the second dummy sub-pixels DSP2 arranged in four lines.

Meanwhile, the arrangement structure of the dummy sub-pixel shown in FIG. 11 is only an example, while the upper dummy sub-pixel area DSPUA may be provided with the second dummy sub-pixels DSP2, the lower dummy sub-pixel area DSPLA may be provided with the first dummy sub-pixels DSP1. In addition, while the right dummy sub-pixel area DSPRA may be provided with the second dummy sub-pixels DSP2 arranged in four lines, the left dummy sub-pixel area DSPLA may be provided with the second dummy sub-pixels DSP2 arranged in the line.

Unlike this, while the upper dummy sub-pixel area DSPUA may be provided with the third dummy sub-pixels DSP2, the lower dummy sub-pixel area DSPLA may be provided with the second dummy sub-pixels DSP2. In addition, while the right dummy sub-pixel area DSPRA is provided with the third dummy sub-pixels DSP3 arranged in four lines, the left dummy sub-pixel area DSPLA may be provided with the first dummy sub-pixels DSP1 arranged in a line. In addition, when combining the dummy sub-pixels DSP1 to DSP3 shown in FIG. 7 to FIG. 9, the combination of the dummy sub-pixels may be changed by those skilled in the art. For example, the arrangement of the dummy sub-pixels may be changed in the method of deleting (or non-forming) the dummy sub-pixels included in the portion of the upper dummy sub-pixel area DSPUA, the lower dummy sub-pixel area DSPLA, the right dummy sub-pixel area DSPUA and the left dummy sub-pixel area DSPLA.

A Third Example

Figure 12:
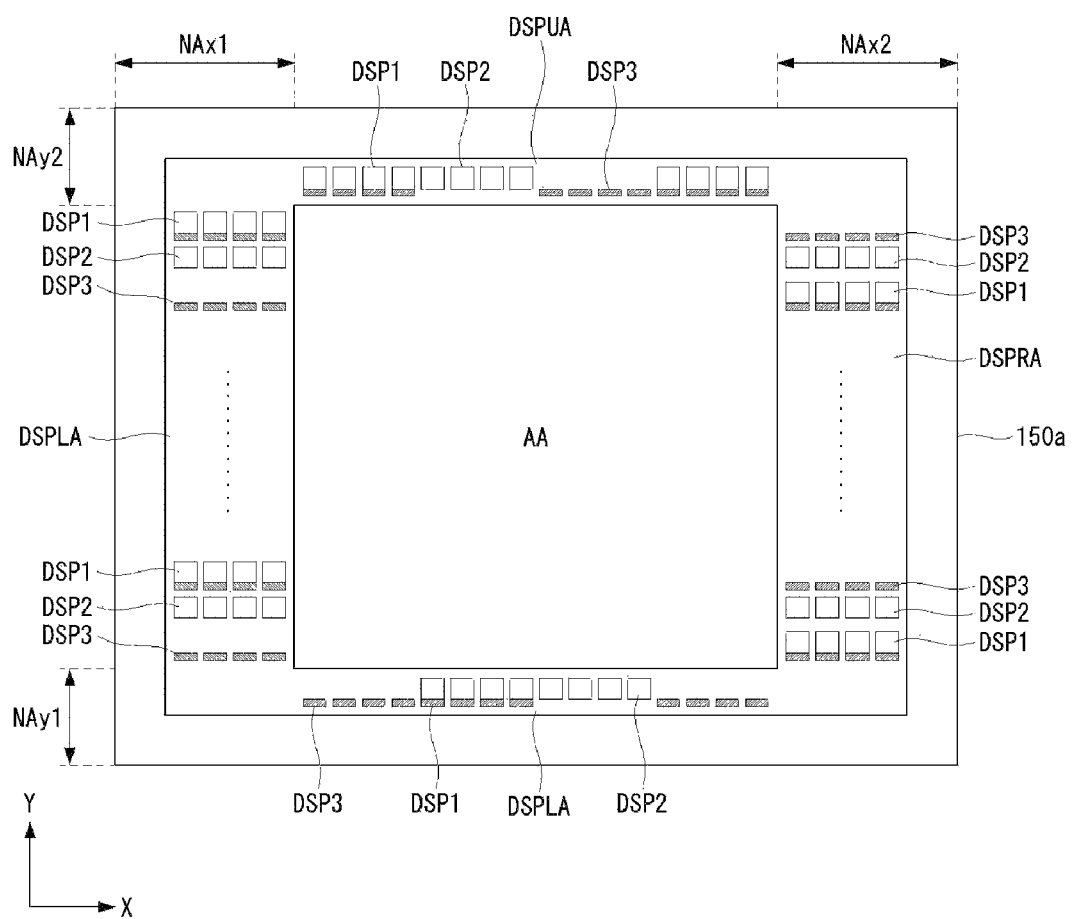

As shown in FIG. 12, the dummy sub-pixels according to a third example are disposed so that the shape for each area corresponding to each other in the up and down and left and right based on the display area AA is different.

The upper dummy sub-pixels formed at the upper portion of the display area AA and the lower dummy sub-pixels formed at the lower portion thereof have the different arrangement structure for each area. That is, while the upper dummy sub-pixel area DSPUA is provided with the dummy sub-pixels in order of the first, second and third dummy sub-pixels DSP1, DSP2 and DSP3, the lower dummy sub-pixel area DSPLA is provided with the dummy sub-pixels in order of the third, second and first dummy sub-pixels DSP3, DSP2 and DSP1. Further, the right dummy sub-pixels formed at the right side of the display area AA have the different arrangement structure from the left dummy sub-pixels formed at the left side thereof. That is, while the right dummy sub-pixel area DSPRA is provided with the dummy sub-pixels in the order of the third, second and first dummy sub-pixels DSP3, DSP2 and DSP1, the left dummy sub-pixel area DSPLA is provided with the dummy sub-pixels in the order of the first, second and third dummy sub-pixels DSP1, DSP2 and DSP3.

Meanwhile, the arrangement structure of the dummy sub-pixel shown in FIG. 12 is only example, while the upper dummy sub-pixel area DSPUA is provided with the dummy sub-pixels in the order of the third, second and first dummy sub-pixels DSP3, DSP2 and DSP1, the lower dummy sub-pixel area DSPLA may be provided with the dummy sub-pixels in the order of the first, second and third dummy sub-pixels DSP1, DSP2 and DSP3. That is, while the right dummy sub-pixel area DSPRA is provided with the dummy sub-pixels in the order of the first, second and third dummy sub-pixels DSP1, DSP2 and DSP3, the left dummy sub-pixel area DSPLA may be provided with the dummy sub-pixels in the order of the third, second and first dummy sub-pixels DSP3, DSP2 and DSP1.

Unlike this, while the upper dummy sub-pixel area DSPUA is provided with the dummy sub-pixels in order of the second, first and third dummy sub-pixels DSP2, DSP1 and DSP3, the lower dummy sub-pixel area DSPLA may be provided with the dummy sub-pixels in order of the third, first and second dummy sub-pixels DSP3, DSP1 and DSP2. That is, while the right dummy sub-pixel area DSPRA is provided with the dummy sub-pixels in the order of the second, third and first dummy sub-pixels DSP2, DSP3 and DSP1, the left dummy sub-pixel area DSPLA may be provided with the dummy sub-pixels in the order of the first, third and second dummy sub-pixels DSP1, DSP3 and DSP2. In addition, when combining the dummy sub-pixels DSP1 to DSP3 shown in FIG. 7 to FIG. 9, the combination of the dummy sub-pixels may be changed by those skilled in the art. For example, the arrangement of the dummy sub-pixels may be changed in the method of deleting (or non-forming) the dummy sub-pixels included in the portion of the upper dummy sub-pixel area DSPUA, the lower dummy sub-pixel area DSPLA, the right dummy sub-pixel area DSPRA and the left dummy sub-pixel area DSPLA.

A Fourth Example

Figure 13:
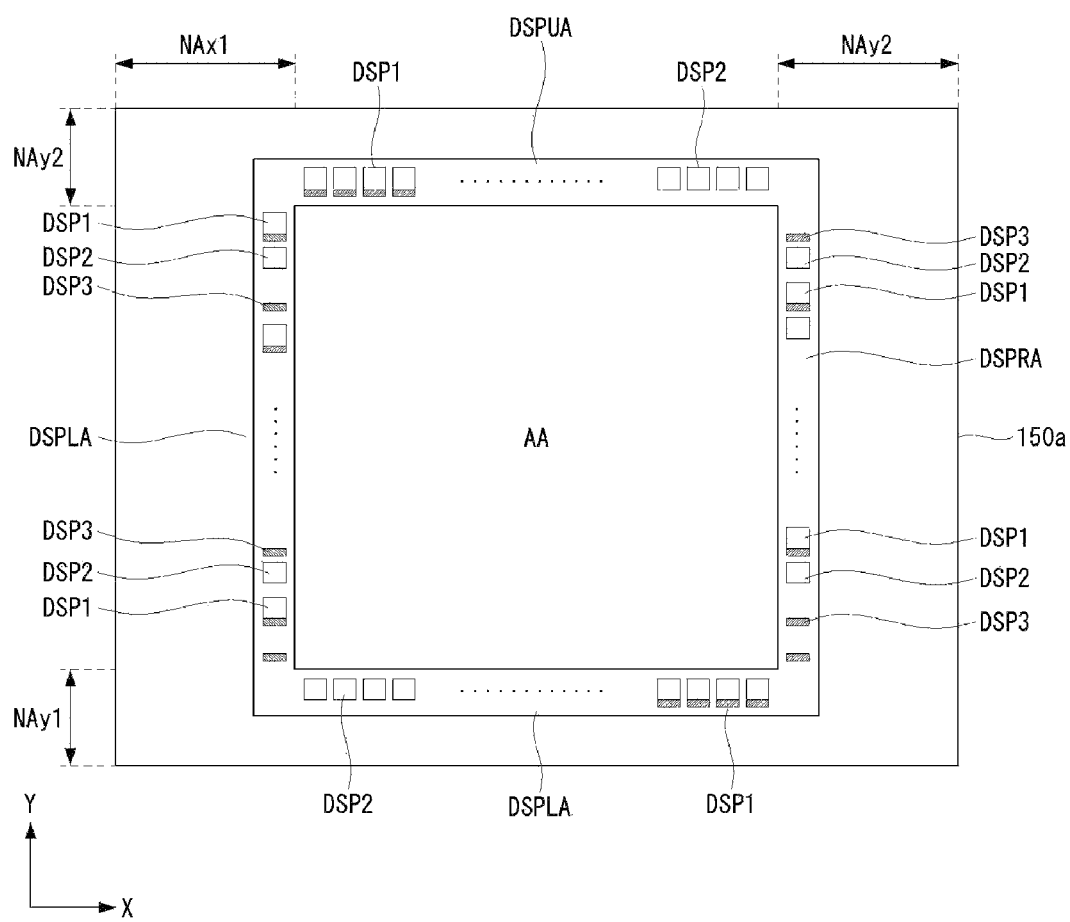

As shown in FIG. 13, the dummy sub-pixels according to a fourth example are disposed so that the shape for each area corresponding to each other in the up and down and left and right based on the display area AA is different and the shapes in a slope direction (or a diagonal direction) of the up and down and left and right are the same.

The upper dummy sub-pixels formed at the upper portion of the display area AA and the lower dummy sub-pixels formed at the lower portion thereof have the different arrangement structure for each area, but have the same shape in the slope direction. That is, while the first and second dummy sub-pixels DSP1 and DSP2 are formed in the first line and the last line of the upper dummy sub-pixel area DSPUA, the second and first dummy sub-pixels DSP2 and DSP1 are formed in the first line and the last line of the lower dummy sub-pixel area DSPLA. The right dummy sub-pixels formed at the right side of the display area AA and the left dummy sub-pixels formed at the left side thereof have the different arrangement structure for each area, but have the same shape in the slope direction. That is, while the third, second and first dummy sub-pixels DSP3, DSP2 and DSP1 are formed in the first line and the last line of the right dummy sub-pixel area DSPUA, the first, second and third dummy sub-pixels DSP1, DSP2 and DSP3 are formed in the first line and the last line of the left dummy sub-pixel area DSPLA.

Meanwhile, thee arrangement structure of the dummy sub-pixel shown in FIG. 13 is only example, while the second and third dummy sub-pixels DSP2 and DSP3 are formed in the first line and the last line of the upper dummy sub-pixel area DSPUA, the third and second dummy sub-pixels DSP3 and DSP2 may be formed in the first line and the last line of the lower dummy sub-pixel area DSPLA.

That is, while the second, third and first dummy sub-pixels DSP2, DSP3 and DSP1 may be formed in the first line and the last line of the right dummy sub-pixel area DSPRA, the first, third and second dummy sub-pixels DSP1, DSP3 and DSP2 may be formed in the first line and the last line of the left dummy sub-pixel area DSPLA. In addition, when combining the dummy sub-pixels DSP1 to DSP3 shown in FIG. 7 to FIG. 9, the combination of the dummy sub-pixels may be changed by those skilled in the art. For example, the arrangement of the dummy sub-pixels may be changed in the method of deleting (or non-forming) the dummy sub-pixels included in the portion of the upper dummy sub-pixel area DSPUA, the lower dummy sub-pixel area DSPLA, the right dummy sub-pixel area DSPRA and the left dummy sub-pixel area DSPLA.

A Fifth Example

Figure 14:
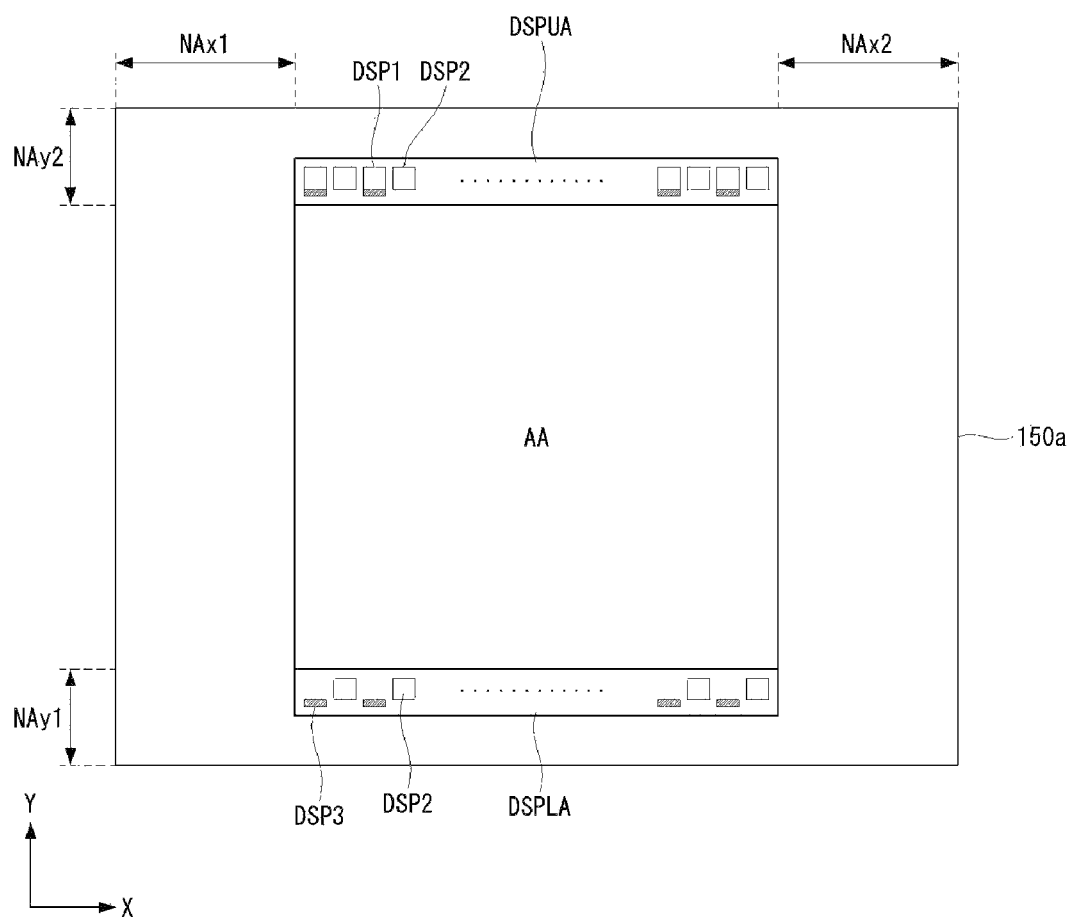

As shown in FIG. 14, the two dummy sub-pixels according to a fifth example are alternately arranged so that the shape for each area corresponding to each other in the up and down based on the display area AA is different. However, the dummy sub-pixels positioned at the left and right based on the display area AA are deleted (or not formed).

The upper dummy sub-pixels formed at the upper portion of the display area AA and the lower dummy sub-pixels formed at the lower portion thereof have the structure in which the two dummy sub-pixels are alternately arranged. That is, while the first and second dummy sub-pixels DSP1 and DSP2 are alternately arranged in the upper dummy sub-pixel area DSPUA, the third and second dummy sub-pixels DSP3 and DSP2 are alternately arranged in the lower dummy sub-pixel area DSPLA.

Meanwhile, the arrangement structure of the dummy sub-pixel shown in FIG. 14 is only example, the first and third dummy sub-pixels DSP1 and DSP3 may be alternately arranged in the upper dummy sub-pixel area DSPUA and the third and first dummy sub-pixels DSP3 and DSP1 may be alternately arranged in the lower dummy sub-pixel area DSPLA. In addition, when combining the dummy sub-pixels DSP1 to DSP3 shown in FIG. 7 to FIG. 9, the combination of the dummy sub-pixels may be changed by those skilled in the art. For example, the arrangement of the dummy sub-pixels may be changed in the method of deleting (or non-forming) the dummy sub-pixels included in the portion of the upper dummy sub-pixel area DSPUA and the lower dummy sub-pixel area DSPLA. In addition, in the above description, although the dummy sub-pixels are alternately arranged, the dummy pixels may be alternately arranged.

A Sixth Example

Figure 15:
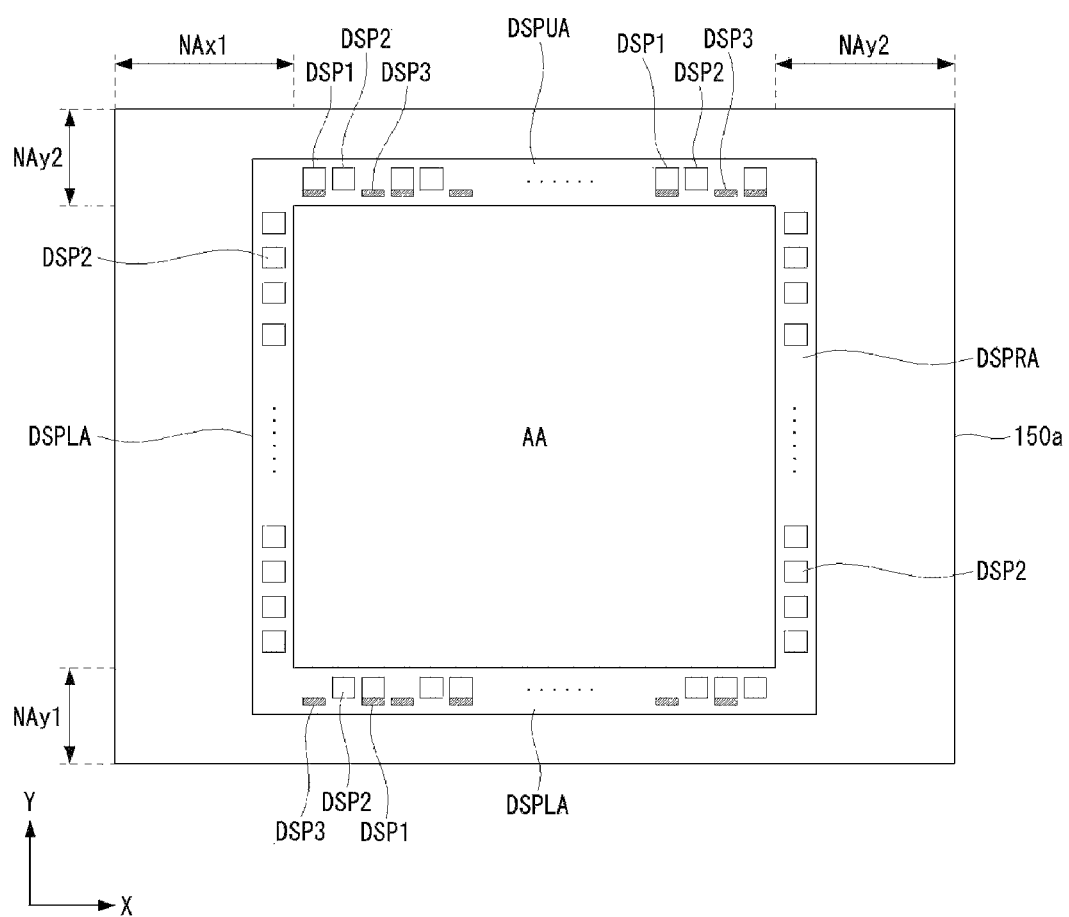

As shown in FIG. 15, the three dummy sub-pixels according to a sixth example are alternately arranged so that the shape for each area corresponding to each other in the up and down based on the display area AA is different. However, the dummy sub-pixels positioned at the left and right based on the display area AA are arranged in the same shape.

The upper dummy sub-pixels formed at the upper portion of the display area AA and the lower dummy sub-pixels formed at the lower portion thereof have the structure in which the three dummy sub-pixels are alternately arranged. That is, while the first, second and third dummy sub-pixels DSP1, DSP2 and DSP3 are alternately arranged in the upper dummy sub-pixel area DSPUA, the third, second and first dummy sub-pixels DSP3, DSP2 and DSP1 are alternately arranged in the lower dummy sub-pixel area DSPLA.

Meanwhile, the arrangement structure of the dummy sub-pixel shown in FIG. 15 is only example, the second, third and first dummy sub-pixels DSP2, DSP3 and DSP1 may be alternately arranged in the upper dummy sub-pixel area DSPUA and the first, third and second dummy sub-pixels DSP1, DSP3 and DSP2 may be alternately arranged in the lower dummy sub-pixel area DSPLA. In addition, when combining the dummy sub-pixels DSP1 to DSP3 shown in FIG. 7 to FIG. 9, the combination of the dummy sub-pixels may be changed by those skilled in the art. For example, the arrangement of the dummy sub-pixels may be changed in the method of deleting (or non-forming) the dummy sub-pixels included in the portion of the upper dummy sub-pixel area DSPUA and the lower dummy sub-pixel area DSPLA. In addition, in the above description, although the dummy sub-pixels are alternately arranged, the dummy pixels may be alternately arranged.

Meanwhile, the reason for forming the dummy sub-pixels according to the first to sixth examples is to reduce process variation or side effects during a process of manufacturing the display panel, the example thereof will be described below.

Figure 16:
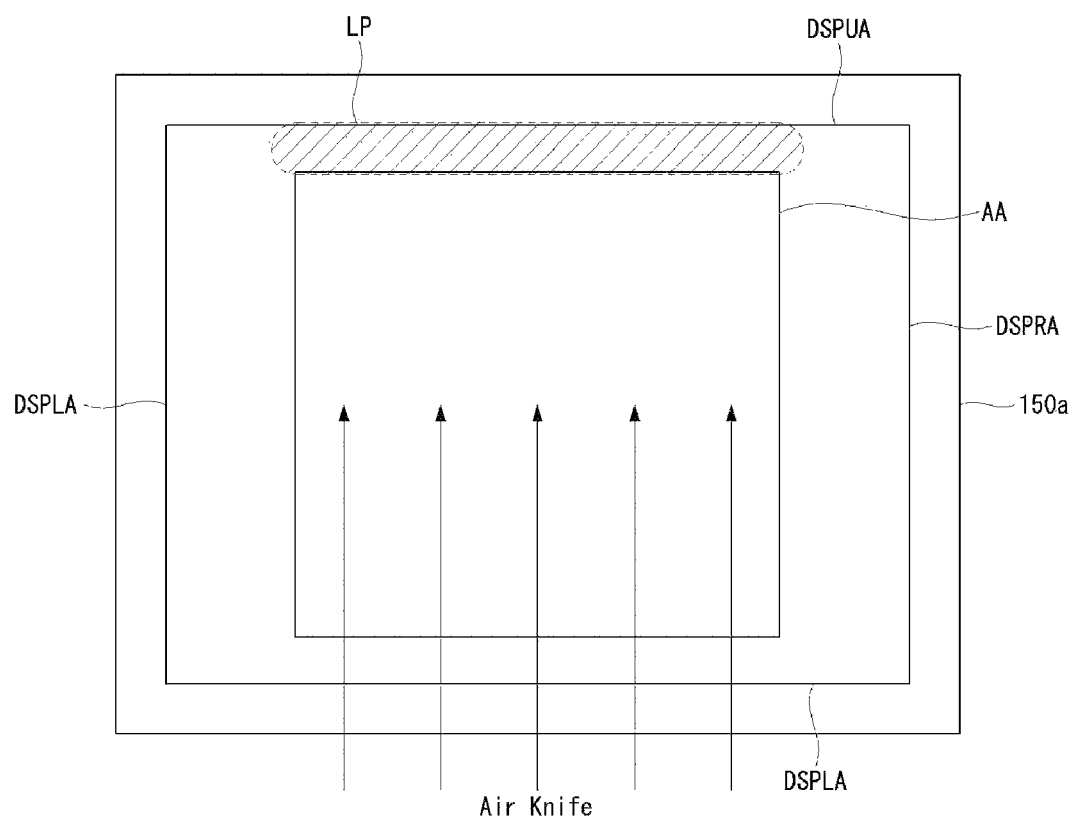
FIG. 16 is a view for explaining the reason that dummy sub-pixels have different shape.

FIG. 16 is a view for explaining the reason that dummy sub-pixels have different shape.

A process of forming the sub-pixels on the display area AA defined on the substrate 150a includes a process etching the specific pattern. Unlike dry etching, wet etching uses a specific solution (hereinafter, referred to as an etching solution) in order to remove by melting the corrosion only for the target metal. After the wet etching is performed, a process for removing the etching solution by using an air knife involves. For example, in the case in which the air knife moves upward from the lower direction of the substrate 150a, the etching solution flows into the upper dummy sub-pixel area DSPUA. In this case, in the upper dummy sub-pixel area DSPUA, the load of the etching solution is increased. Therefore, when the first dummy sub-pixel having a large size (or area) and density difference of the pattern is formed at the upper dummy sub-pixel area DSPUA, the etching solution flows into the upper dummy sub-pixel area DSPUA, thereby making it possible to prevent the remaining etching solution from adversely effecting the display area AA.

However, this is only one example, it is possible to minimize a loading effect (a phenomenon in which the etching rate changes according to the size and density difference of the pattern at the time of the etching process) due to the etching solution by the dummy sub-pixels having the different shape. In addition, the dummy sub-pixel may be used in order to check a deposition rate of an organic matter or an inorganic matter which is deposited into the opening, or be used in order to compensate a driving voltage or a driving current after the display panel is manufactured. Therefore, as in an embodiment of the present disclosure, the reason that the shape of the dummy sub-pixels may change the number and arrangement of the dummy sub-pixels for each position is not limited thereto. Further, the method in which the shape of the dummy sub-pixels may change the number and arrangement of the dummy sub-pixels for each position may be changed depending on the purposed and effect, the present disclosure is not limited thereto and may be changed in various forms.

The present disclosure provides the organic light emitting display device capable of implementing a display panel with a high-resolution by increasing the process margin rate and simplifying the process in addition to minimizing various side effects capable of generating until it is commercialized from the manufacturing process by changing the shape, number, and arrangement of the dummy sub-pixels.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display device, comprising:
   a substrate defined into a display area and a non-display area;
   sub-pixels formed on the display area of the substrate; and
   dummy sub-pixels formed on the non-display area of the substrate,
   wherein the dummy sub-pixels corresponding to different positions of the non-display area comprise one or more first dummy sub-pixels including both an organic light emitting diode (OLED) part and a thin film transistor (TFT) part of the sub-pixels, one or more second dummy sub-pixels including the OLED part of the sub-pixels without the TFT part of the sub-pixels, and one or more third dummy sub-pixels including the TFT part of the sub-pixels without the OLED part of the sub-pixels.

2. The organic light emitting display device of claim 1, wherein the first, the second, and the third dummy sub-pixels are disposed so that the second and third dummy sub-pixels are alternated with each other.

3. The organic light emitting display device of claim 1, wherein a number of the dummy sub-pixels is different for each position of the non-display area.

4. The organic light emitting display device of claim 1, wherein upper dummy sub-pixels formed on an upper portion of the non-display area have a same arrangement structure as lower dummy sub-pixels formed on a lower portion of the non-display area, and right dummy sub-pixels formed on a right side of the non-display area have a same arrangement structure as left dummy sub-pixels formed on a left side of the non-display area.

5. The organic light emitting display device of claim 1, wherein upper dummy sub-pixels formed on an upper portion of the display area have a different arrangement structure from lower dummy sub-pixels formed on a lower portion of the display area, and right dummy sub-pixels formed on a right side of the display area have a different arrangement structure from left dummy sub-pixels formed on a left side of the display area.

6. The organic light emitting display device of claim 1, wherein upper dummy sub-pixels formed on an upper portion of the display area have a same arrangement structure as lower dummy sub-pixels formed on a lower portion of the display area, and right dummy sub-pixels formed on a right side of the display area have a different arrangement structure from left dummy sub-pixels formed on a left side of the display area.

7. The organic light emitting display device of claim 1, wherein upper dummy sub-pixels formed on an upper portion of the display area have a different arrangement structure from lower dummy sub-pixels formed on a lower portion of the display area, and right dummy sub-pixels formed on a right side of the display area have a same arrangement structure as left dummy sub-pixels formed on a left side of the display area.

8. The organic light emitting display device of claim 1, wherein the first, the second, and the third dummy sub-pixels are defined into a single dummy pixel.

9. The organic light emitting display device of claim 1, wherein four of the dummy sub-pixels are defined into a single dummy pixel.

* * * * *